United States Patent
Noh (10) Patent No.: US 12,414,245 B2
(45) Date of Patent: Sep. 9, 2025

(54) DISPLAY DEVICE INCLUDING BENDING SUPPORT

(71) Applicant: LG Display Co., Ltd., Seoul (KR)

(72) Inventor: Heeseok Noh, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 207 days.

(21) Appl. No.: 18/495,492

(22) Filed: Oct. 26, 2023

(65) Prior Publication Data

US 2024/0206087 A1 Jun. 20, 2024

(30) Foreign Application Priority Data

Dec. 15, 2022 (KR) .................. 10-2022-0176047

(51) Int. Cl.
*H05K 5/02* (2006.01)

(52) U.S. Cl.
CPC .................................... *H05K 5/02* (2013.01)

(58) Field of Classification Search
CPC .......... H05K 2/02; H05K 1/189; H05K 1/181; H05K 1/028; H05K 1/147; H05K 5/0217; H05K 5/03; G06F 1/1652; G06F 1/1601; G06F 1/1682; G06F 1/183
See application file for complete search history.

(56) References Cited

U.S. PATENT DOCUMENTS

| | | | |
|---|---|---|---|
| 9,379,355 B1 | 6/2016 | Lee | |
| 9,425,418 B2 * | 8/2016 | Kwon | H10K 59/873 |
| 9,847,506 B2 | 12/2017 | Lee | |
| 10,229,963 B1 * | 3/2019 | Qi | G02F 1/13452 |
| 10,462,896 B1 * | 10/2019 | Kwon | H10K 59/12 |
| 10,496,136 B2 * | 12/2019 | Kim | H10K 59/873 |
| 10,505,147 B2 | 12/2019 | Lee | |
| 2017/0047547 A1 * | 2/2017 | Son | H10K 50/844 |
| 2017/0250237 A1 * | 8/2017 | Cheng | H10K 50/844 |
| 2020/0196496 A1 * | 6/2020 | Shin | G06F 1/16 |
| 2022/0199922 A1 | 6/2022 | Choi et al. | |
| 2023/0171905 A1 * | 6/2023 | Kwon | H05K 5/0217 361/807 |
| 2023/0189441 A1 * | 6/2023 | Park | G02F 1/13452 361/807 |

FOREIGN PATENT DOCUMENTS

| | | |
|---|---|---|
| KR | 20220090038 A | 6/2022 |
| KR | 20220098389 A | 7/2022 |

* cited by examiner

*Primary Examiner* — Abhishek M Rathod
(74) *Attorney, Agent, or Firm* — Seed Intellectual Property Law Group LLP (57) ABSTRACT

A display device includes a display panel including a first area, a second area and a bent area. The device includes a first support plate disposed under the display panel and supporting the first area and the bent area of the display panel as well as a second support plate disposed on the display panel and supporting the second area of the display panel. The device further includes a bending support disposed between the first support plate and the second support plate, and supporting a bent portion of the bent area of the display panel. The bending support has a curling shape in the bent area of the display panel and an outermost surface of curved form of the curling shape is in contact with a curved inner surface of the bent portion of the display panel.

22 Claims, 8 Drawing Sheets

DISPLAY DEVICE INCLUDING BENDING SUPPORT

CROSS-REFERENCE TO RELATED APPLICATION

This application claims priority from Korean Patent Application No. 10-2022-0176047 filed on Dec. 15, 2022 in the Korean Intellectual Property Office, and all the benefits accruing therefrom under 35 U.S.C. 119, the contents of which are incorporated herein by reference in their entirety.

BACKGROUND

Technical Field

The present disclosure relates to a display device and a method for manufacturing the same.

Description of Related Art

A display device includes a display area for displaying a screen and a non-display area formed along an outer edge of the display area. A display device requires not only a display panel for displaying the screen but also various additional components such as a driver integrated circuit (IC) or a circuit board.

Additional components may be disposed in the non-display area, or various connection components such as a flexible printed circuit board for connection of the additional components may be disposed in the non-display area.

In the display device, the non-display area is also called a bezel area. When the bezel area is thick, the user's gaze is dispersed. When the bezel area is thin, the user's gaze is fixed onto the screen in the display area, thereby increasing the user's immersion.

BRIEF SUMMARY

In the display device, various additional components such as a driver integrated circuit or a circuit board as well as a pad of a display panel are disposed on a rear surface of the display panel to secure the widest display area and minimize a bezel area.

Various additional components are disposed inwardly of a cover glass CG and are mounted onto or connected to a connection component such as a flexible printed circuit board to constitute a module.

These various additional components are protected from external damage or when the module is dropped by a back frame attached to the cover glass CG. Moreover, the back frame prevents foreign substances and moisture from penetrating into the module.

However, when an impact due to user environment or fall down is applied to the back frame made of a metal such as aluminum (Al), the frame is deformed such that a damage is applied to a bent area, resulting in pattern cracks and screen abnormalities.

There is a problem in that there is a limit to implementation of a stable narrow bezel due to lack of a structure that reinforces stiffness of the bent area.

Accordingly, in order to solve the above-described problem, the inventor of the present disclosure has invented a display device in which when stress due to external force occurs in a bent portion of the display panel of the display device, deformation is minimized using an inner support structure to secure reliability such that a stable narrow bezel can be implemented.

Moreover, a technical purpose according to an embodiment of the present disclosure is to provide a display device that reinforces the rigidity of a panel bent area.

Moreover, the inventor of the present disclosure has invented a display device manufacturing method in which an outer surface of a curling shape of the bending support is curved and contacts and supports an inner curved surface of the bent area of the panel, thereby minimizing the bent area deformation caused by external force and preventing the panel cracks.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

A display device according to an embodiment of the present disclosure includes a display panel including a first area, a second area and a bent area, wherein the first and second areas face each other in a bent state of the display panel; a first support plate disposed under the display panel, and support the first area and the bent area of the display panel; a second support plate disposed on the display panel, and support the second area of the display panel; and a bending support disposed between the first support plate and the second support plate, and support a bent portion of the bent area of the display panel, wherein the bending support has a curling shape in the bent area, wherein an outermost surface of curved form of the curling shape is contact with a curved inner surface of the bent portion of the bent area of the display panel.

A method for manufacturing a display device according to an embodiment of the present disclosure includes forming a bending support having one end having a curling shape; disposing a first support plate under one side of the display panel, and disposing the second support plate under the other side of the display panel; disposing the bending support under the first support plate; bending the display panel, and the second support plate is disposed on the other side of the bended the display panel; and disposing a connection member between the first support plate and the second support plate, wherein an outermost surface of the curved form of the curling shape is in contact with a curved inner surface of a bent portion of the bent area of the display panel.

According to the embodiment of the present disclosure, reinforcing the stiffness of the panel bent area in the bezel area of the display device may allow the product quality to be improved, and thus product reliability to be secured, thereby implementing a narrow bezel.

Moreover, according to the embodiment of the present disclosure, applying a rigid structure to the panel bent area may result in minimizing damage to the panel upon external impact.

Moreover, according to the embodiment of the present disclosure, the curved shape of the bending support directly contacts the panel bent area in the curved manner such that the bending deformation may be minimized.

Moreover, according to the embodiment of the present disclosure, the bending deformation of the panel bent area is minimized, thereby improving screen defects.

Moreover, according to the embodiment of the present disclosure, when an impact is applied to the bent area of the panel, the curling shape may perform a cushion action to prevent cracks and damage to the panel. Accordingly, a long-life and low-power display device may be realized.

The display device according to the present disclosure reinforces the stiffness of the bent area without adding additional components. Thus, the manufacturing process may be simplified, and the manufacturing cost may be reduced and the product quality may be improved.

In the display device according to the present disclosure, the curling shape is implemented to have an optimal shape such that the curling shape may mitigate the impact. Further, the coating surface treatment (urethane coating) may be applied to a boundary surface of different materials in an area of the bending support in contact with the panel, thereby reducing the friction of the bent area and thus preventing cracks of the display panel.

Effects of the present disclosure are not limited to the effects mentioned above, and other effects not mentioned will be clearly understood by those skilled in the art from the descriptions below.

In addition to the above effects, the specific effects of the present disclosure are described together while describing specific details for implementing the embodiments of the present disclosure below.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTIONS

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs, and the claims are not limited by the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure.

A shape, a size, a ratio, an angle, a number, etc., disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event may occur therebetween unless "directly after," "directly subsequent" or "directly before" is not indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to," or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or.' That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, according to an embodiment of the present disclosure, a display device and a manufacturing method thereof in which the rigidity of the panel bent area may be reinforced using a bending support for supporting the bent area of the panel without adding a separate part, such that process simplification is achieved, a manufacturing cost is lowered, and product quality is improved will be described.

Figure 1:
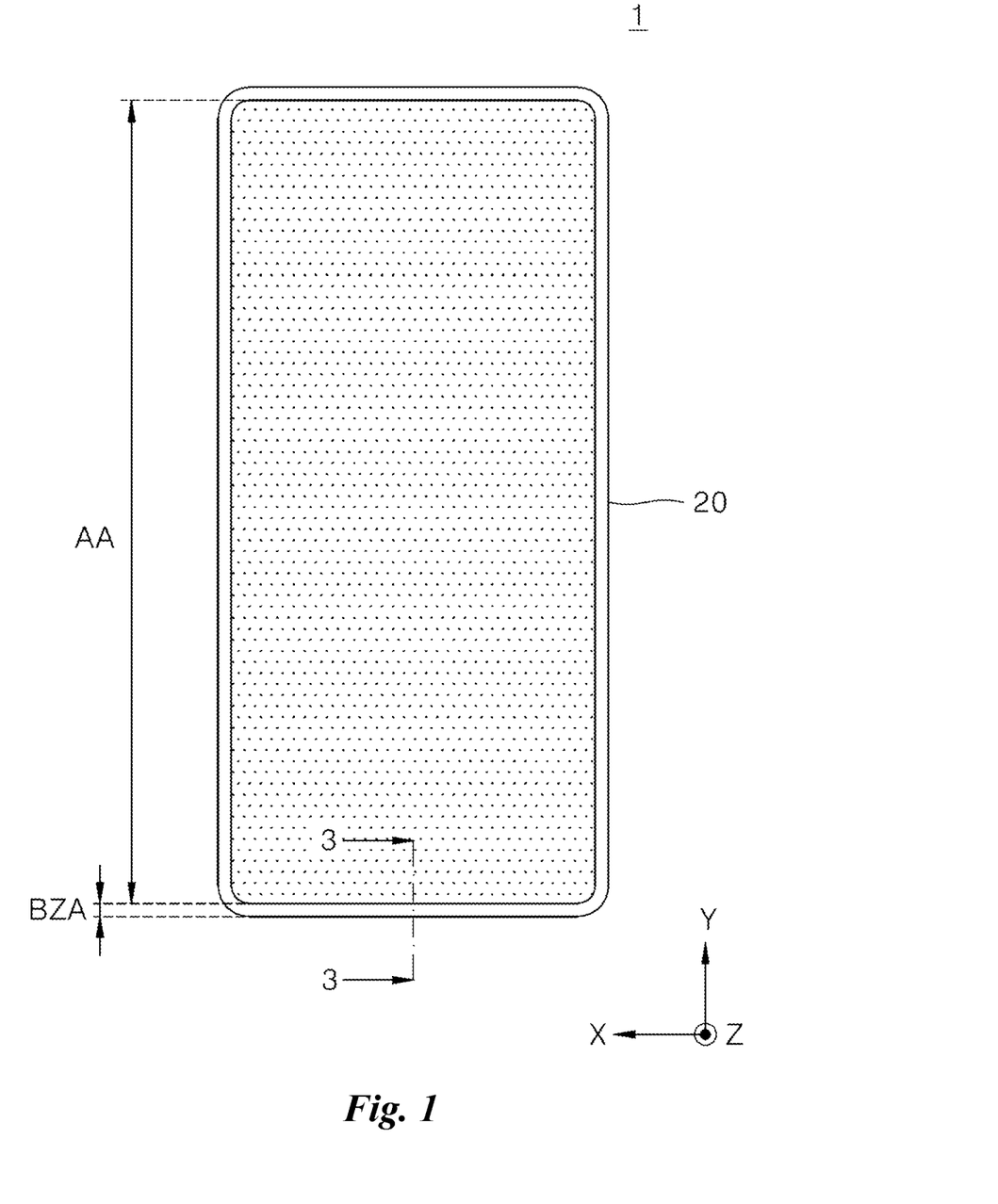
FIG. 1 shows a front view of a display device according to an embodiment of the present disclosure.
Figure 2:
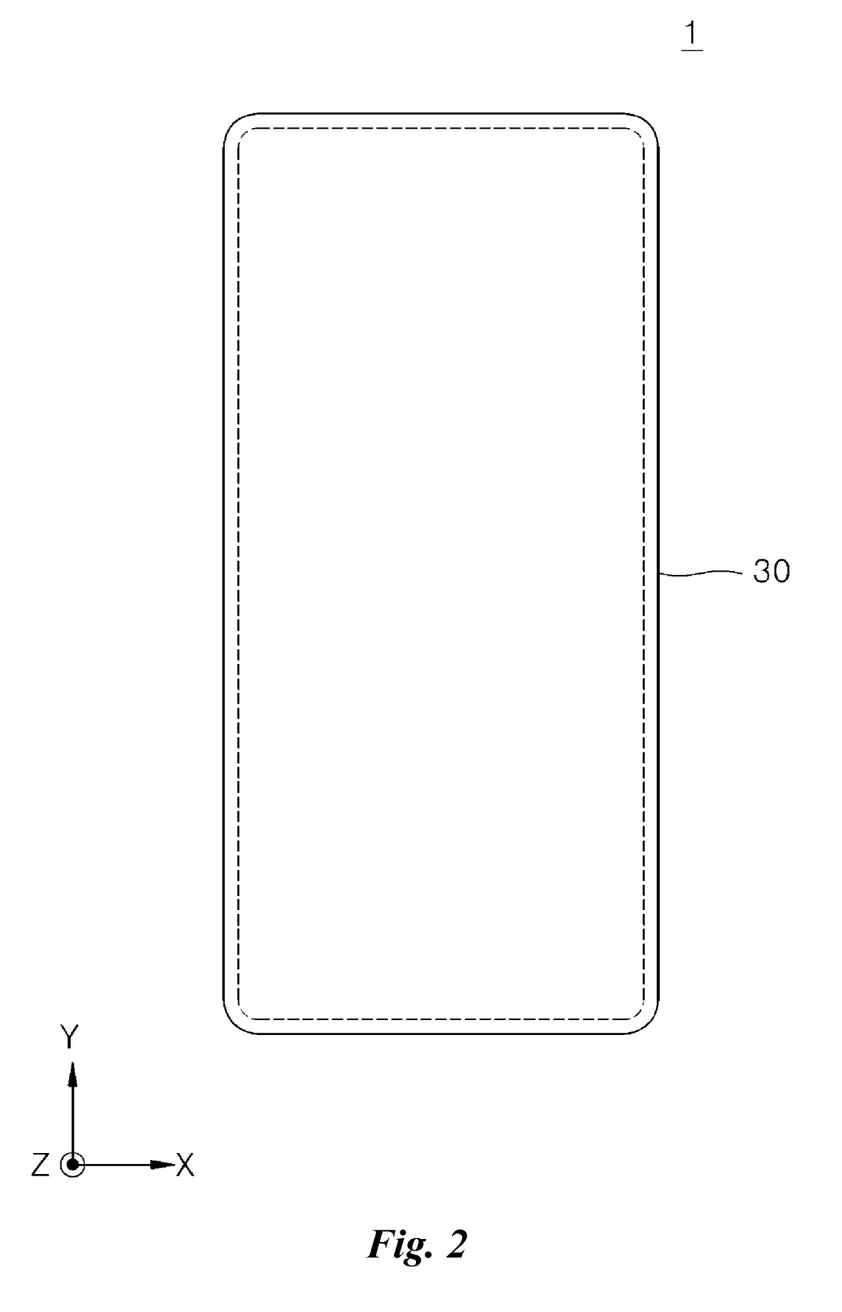
FIG. 2 shows a rear view of a display device according to an embodiment of the present disclosure.

FIG. 1 shows a front view of a display device according to an embodiment of the present disclosure. FIG. 2 shows a rear view of a display device according to an embodiment of the present disclosure.

FIG. 1 briefly shows a front surface of a display device 1 where a display area or active area AA is disposed. FIG. 2 shows a simplified view of a rear surface of the display device 1.

A direction facing toward the front surface, and an upward direction defined in the present disclosure may mean a Z-axis direction, for example, and a direction facing toward the rear surface and a downward direction may means a −Z-axis direction, for example.

Referring to FIG. 1 and FIG. 2, the display device 1 according to an embodiment of the present disclosure includes a cover member 20 constituting the front surface thereof and a back frame 30 constituting the rear surface thereof.

In this regard, the cover member 20 may be referred to as a cover window or a cover glass.

A display module may be disposed between a rear surface of the cover member 20 and an upper surface of the back frame 30. In this regard, the display module will be described in detail in FIG. 3. The display module may include, for example, a flexible substrate, a support plate, a bending support, and a connection member.

The display device 1 may include a display area or active area AA and a bezel area BZA in the front surface thereof. The bezel area BZA may be disposed along the outermost edge of the display device 1 in a form enclosing the display area.

The cover member 20 may be disposed to cover the front surface of the display module and may serve to protect the display module from external impact.

An edge of the cover member 20 may have a round shape curved toward a rear surface thereof on which the display module is disposed.

In this case, the cover member 20 may be disposed to cover at least a partial area of a side surface of the display module disposed on the rear surface of the cover member, and thus may serve to protect not only the front surface of the display module but also the side surface from the external impact.

Because the cover member 20 includes the display area AA that displays the screen, the cover member may be made of a transparent material such as a cover glass to display a screen. For example, the cover member 20 may be made of a transparent plastic material, a glass material, or a tempered glass material.

The back frame 30 may be disposed on a rear surface of the display module and may contact the cover member 20 so as to accommodate therein the display module and support the cover member 20.

The back frame 30 may serve as a housing constituting a rear surface of an outer appearance of the display device 1, and may be made of a metal material such as aluminum or a polymer epoxy-based resin material. Embodiments of the present disclosure are not limited thereto.

In this case, the back frame 30 may function as a casing constituting the outermost part of the display device 1. However, the present disclosure is not limited thereto. For example, the back frame 30 may function as a middle frame serving as a housing protecting the rear surface of the display module.

The display device according to an embodiment of the present disclosure will be described with reference to FIG. 3 to FIG. 7.

Figure 3:
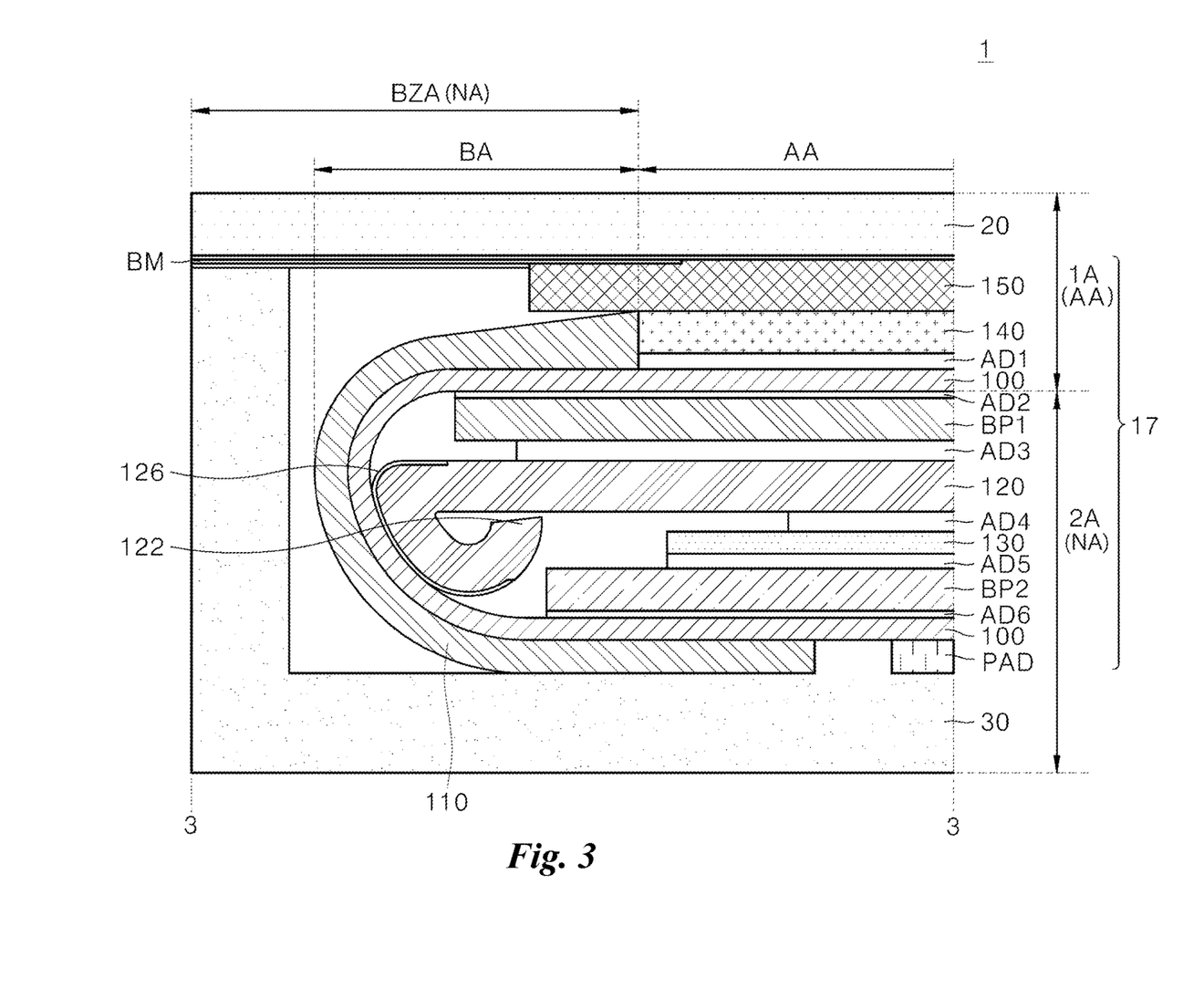
FIG. 3 is a cross-sectional view along a cutting line 3-3 of FIG. 1 according to an embodiment of the present disclosure.
Figure 4:
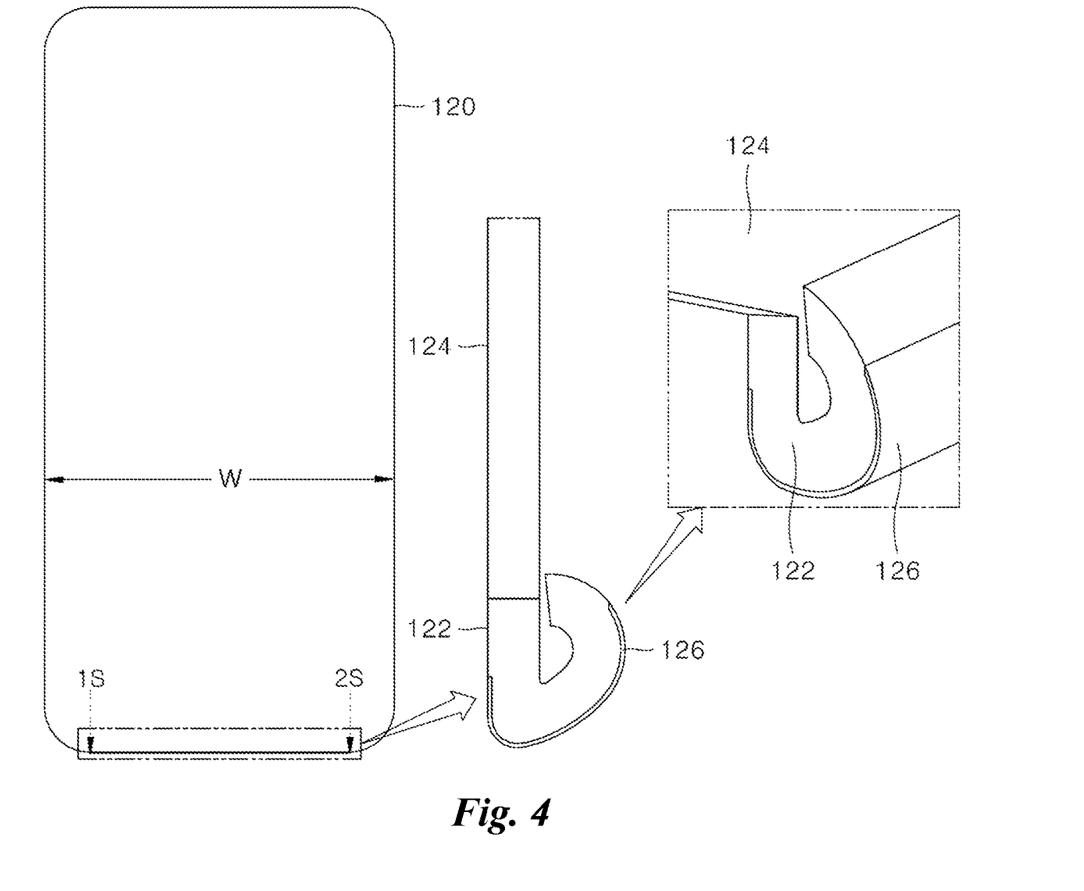
FIG. 4 is a diagram showing a detailed structure of a bending support according to an embodiment of the present disclosure.
Figure 5:
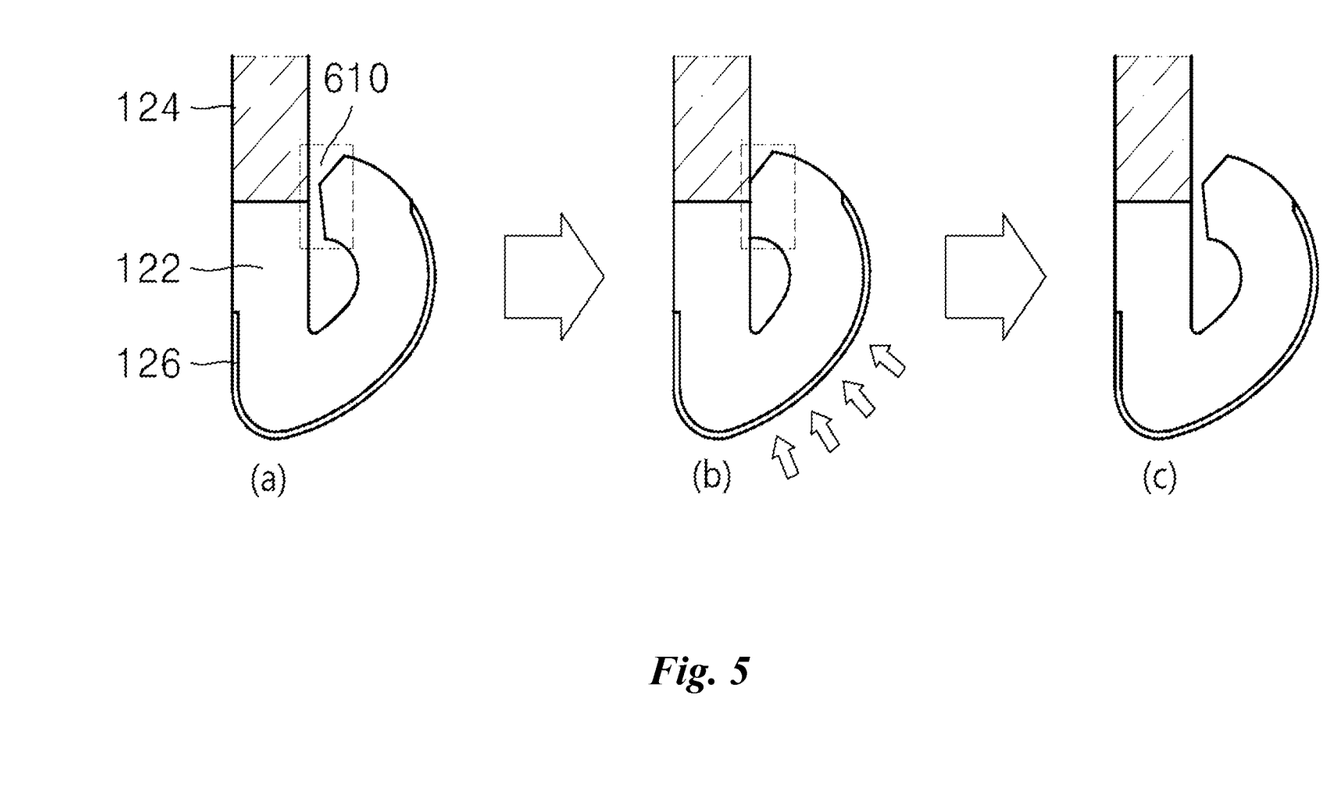
FIG. 5 is a diagram showing an operation when an external force is applied to the bending support according to an embodiment of the present disclosure.
Figure 6:
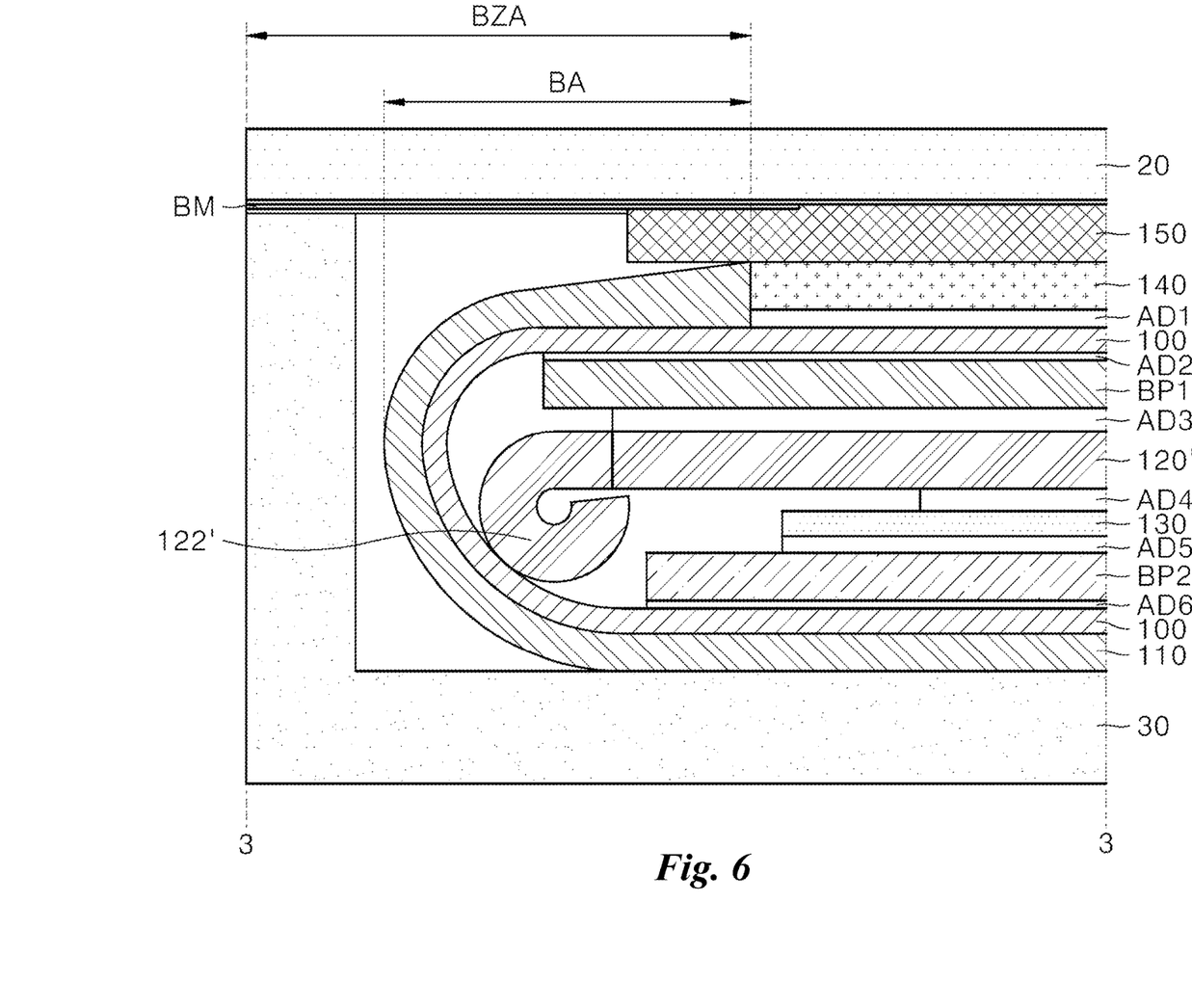
FIG. 6 is a cross-sectional view of a bending support according to another embodiment of the present disclosure along a cutting line 3-3 of FIG. 1.
Figure 7:
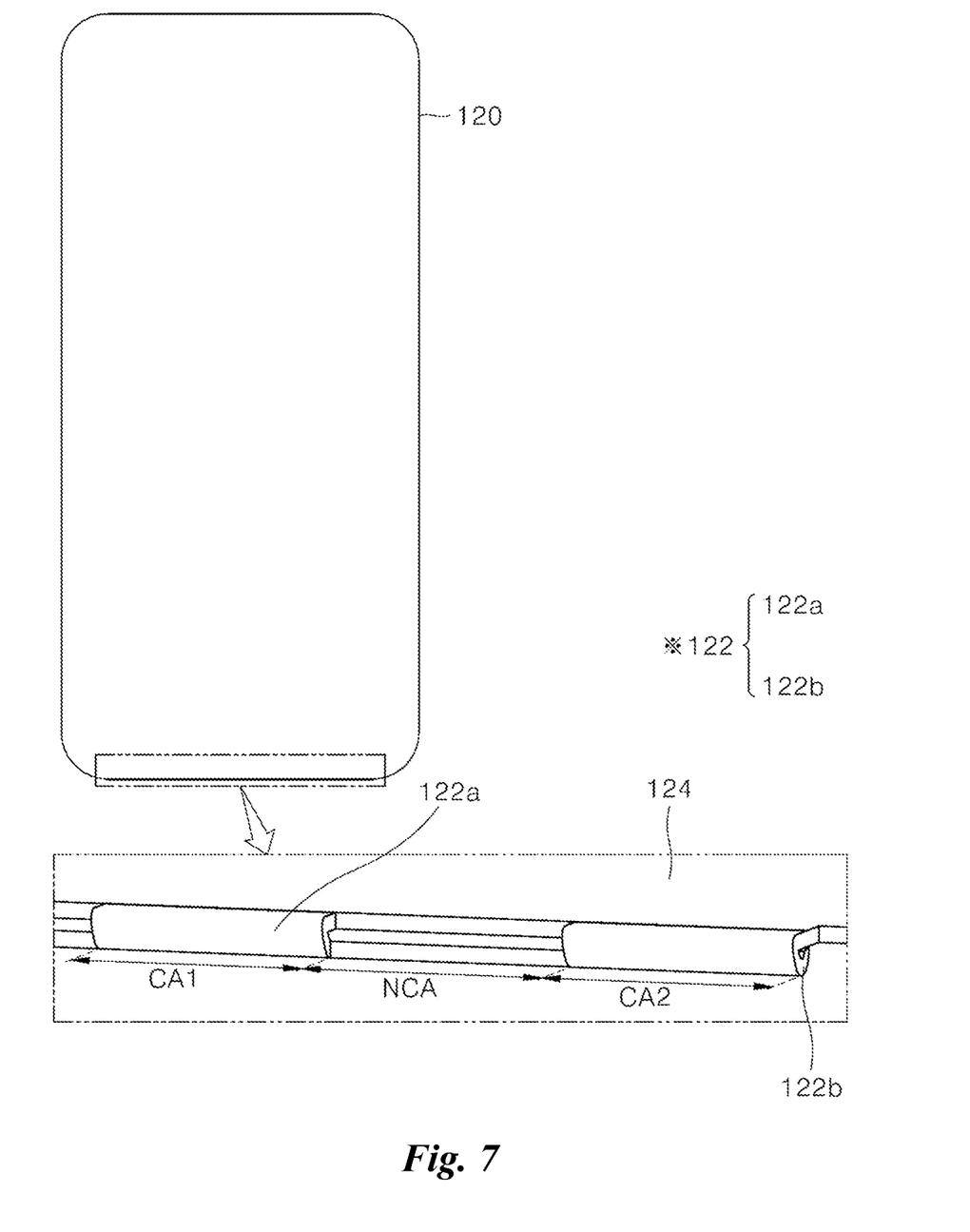
FIG. 7 is a diagram showing a detailed structure of a bending support according to another embodiment of the present disclosure.

FIG. 3 is a cross-sectional view along a cutting line 3-3 of FIG. 1 according to an embodiment of the present disclosure. FIG. 4 is a diagram showing a detailed structure of a bending support 120 according to an embodiment of the present disclosure. FIG. 5 is a diagram showing an operation when an external force is applied to the bending support according to an embodiment of the present disclosure. FIG. 6 is a cross-sectional view of a bending support according to another embodiment of the present disclosure along a cutting line 3-3 of FIG. 1. FIG. 7 is a diagram showing a detailed structure of the bending support according to another embodiment of the present disclosure.

FIG. 3 is a cross-sectional view of a display device according to an embodiment of the present disclosure.

Referring to FIG. 3, the display device 1 according to an embodiment of the present disclosure may include a display module 17, the cover member 20, and the back frame 30.

A front surface of the cover member 20 may be divided into the display area AA and the non-display area NA as an area other than the display area AA. The non-display area NA may be formed along an edge of the display area AA in the front surface of the cover member 20, and may be defined as a bezel area BZA.

A rear surface of the cover member 20 may include the non-display area NA. The non-display area NA may be disposed between the rear surface of the cover member 20 and an upper surface of the back frame 30.

The display module 17 coupled to the rear surface of the cover member 20 may have a bent area BA. The bent area BA may be disposed in the bezel area BZA of the rear surface of the cover member 20 facing in the −Z-axis direction.

In order to reduce the bezel area BZA of the rear surface of the cover member 20, it is necessary to reduce a curvature radius of the bent area BA.

The curvature radius of the bent area BA is proportional to a total thickness of the display module 17 (that is, the total thickness of the display device 1). Thus, when the total thickness increases, the curvature radius of the bent area BA increases. To the contrary, when the total thickness decreases, the curvature radius of the bent area BA decreases.

Therefore, in order not to increase the size of the bezel area BZA, it is necessary to prevent the overall thickness of the display module (or the display device 1) from increasing.

A cross-sectional view along the cutting line 3-3 of FIG. 1 is shown in FIG. 3. The display device 1 as shown in FIG. 3 may include the display module 17, the cover member 20 disposed on top of the display module 17, and the back frame 30 supporting the display module 17 and the cover member 20 while being disposed under the display module 17.

The display module 17 may include a display panel 100. The display panel 100 may be referred to as a 'flexible substrate'. The display panel 100 may include a first area 1A belonging to the front surface of the display panel 100, a second area 2A belonging to the rear surface of the display panel 100, and the bent area BA included in the bezel area BZA of the display device 1. The bent area BA may be disposed to partially overlap each of the first and second areas 1A and 2A while being disposed between the first area 1A and the second area 2A in a vertical direction.

Therefore, the display device 1 may include the display panel 100 which includes the first area 1A belonging to the front surface, the bent area BA, and the second area 2A belonging to the rear surface. The second area 2A may be bent at the bent area BA so as to be disposed under the first area 1A.

The first area 1A has a vertical structure extending from the display panel 100 to the cover member 20 in an upward direction in which the image is displayed and thus may be referred to as the display area AA in the vertical direction.

The second area 2A has a vertical structure extending from the display panel 100 to the back frame 30 in a downward direction in which the image is not displayed, and thus may be referred to as a non-display area NA in the vertical direction.

In the display module 17 and in the first area 1A, a polarization layer 140 may be disposed on the display panel 100 and may be bonded thereto via a first adhesive layer AD1, and the cover member 20 may be disposed on the polarization layer 140 and may be bonded thereto via an optical adhesive layer 150. Moreover, in the display module 17 and in the first area 1A, a black matrix BM may be disposed between the optical adhesive layer 150 and the cover member 20. The black matrix BM may be disposed in the non-display area NA or the bezel area BZA where light does not transmit through, and may serve to prevent light-leakage.

In the display module 17 and in the second area A2, a first support plate BP1 may be disposed under the display panel 100 and may be bonded thereto via a second adhesive layer AD2, and the bending support 120 may be disposed under the first support plate BP1 and may be bonded thereto via a third adhesive layer AD3. The bending support 120 may be embodied as a metal plate including metal. Moreover, in the display module 17 and in the second area A2, the connection member 130 may be disposed under the bending support 120 and may be bonded thereto via a fourth adhesive layer AD4, and a second support plate BP2 may be disposed under the connection member 130 and may be bonded thereto via a fifth adhesive layer AD5, and a portion of the display panel 100 in the second area 2A may be disposed under the second support plate BP2 and may be bonded thereto via a sixth adhesive layer AD6. In this regard, the portion of the reinforcing member 110 in the second area 2A and a pad PAD may be disposed under the portion of the display panel 100 in the second area 2A.

The connection member 130 may be a member that fixes bezel bending.

Some components among the components according to the embodiments of the present disclosure may be omitted according to circumstances, and/or an arrangement order of the components according to the embodiments of the present disclosure may be changed according to circumstances.

The cover member 20 may be disposed on top of the display panel 100 and may include the bezel area BZA including the bent area BA and the first area 1A including the display area AA.

The back frame 30 may support the bezel area BZA of the cover member 20 and the second area 2A of the display panel 100. To this end, the back frame 30 may be in contact with the cover member 20 in the bezel area BZA, and may be in contact with the reinforcing member 110 reinforcing the bending of the display panel 100 in the second area 2A.

The back frame 30 may have a flat lower surface and a vertical surface protruding vertically from the lower surface at an edge thereof. The lower surface of the back frame 30 may be attached to the rear surface of the reinforcing member 110 by means of, for example, a resin or a tape. However, the present disclosure is not limited thereto. A top of a side wall as a top of the vertical surface of the back frame 30 may be adhered to the cover member 20 via, for example, a double-sided tape.

The back frame 30 may have a box shape with an open top, and may accommodate the display module 17 therein. The display module 17 may include the display panel 100.

The display panel 100 may include the first area 1A, the second area 2A, and the bezel area BZA including the bent area BA.

The first area 1A corresponds to the display area AA of the display panel 100, and the second area 2A may include the pad PAD of the display panel 100. The first area 1A and the second area 2A may be disposed to face each other in the vertical direction (the Z direction).

The display panel 100 may have a flat shape in the first area 1A, and may have a shape bent downwardly (in the Z direction) in the bent area BA and may have a flat shape extending from an lower end of the bent area BA in the left and right directions.

The first support plate BP1 may be disposed under the display panel 100. The first support plate BP1 may support the display panel 100 in the first area 1A and the bent area BA of the display panel 100. To this end, an upper surface of the first support plate BP1 may be in contact with a lower surface of the display panel 100, and may be bonded to the lower surface of the display panel 100 via the second adhesive layer AD2.

The first support plate BP1 may include a first back plate.

The second support plate BP2 may include a second back plate.

The second support plate BP2 may be disposed on top of the portion of the display panel 100 in the second area 2A. The second support plate BP2 may support the display panel 100 in the second area 2A. To this end, the second support plate BP2 may be in contact with the upper surface of the portion of the display panel 100 in the second area 2A and may be adhered to the upper surface of the portion of the display panel 100 in the second area 2A via the sixth adhesive layer AD6.

The bending support 120 may be disposed between the first support plate BP1 and the second support plate BP2. The bending support 120 may support a bent portion of the display panel 100 in the bent area BA. To this end, the bending support 120 may have a curling shape in the bent area BA, and the outermost portion of the curling shape may come into contact with the bent portion of the display panel 100 along a curved shape.

The bending support 120 according to the embodiment of the present disclosure may contact the bent area BA of the display panel 100 along the curling shape so as to support the bent area BA of the display panel 100, such that the bent area BA may be protected, and thus a narrow bezel of the display device 1 may be realized.

In the display device 1 according to an embodiment of the present disclosure, the bent area BA of the display panel 100 may be protected by the bending support 120, so that the product may be durable, and the product quality may be improved.

FIG. 4 is a diagram showing a detailed structure of the bending support 120 according to an embodiment of the present disclosure.

An end 122 of the curling shape bent in the bent area BA of the bending support 120 may not contact a flat area of the bending support 120 as shown in FIG. 4.

Referring to FIG. 3 and FIG. 4, the bending support 120 may include a flat part 124 having a flat shape in the first area 1A, and a curved part 122 extending from the flat part 124 and having the curling shape bent in the bent area BA.

The curved part 122 of the bending support 120 may extend from one side end 1S to the other side end 2S by a width W of the bending support 120 or the display panel 100 along the width W direction of the bending support 120 or the width W direction of the display panel 100 in the bent area BA.

The curved part 122 of the bending support 120 may have an upper surface extending from the flat part 124 so as to have a flat shape in the bent area BA, and then may have the curling shape bent downwardly (in the Z direction) from one end of the flat shape.

FIG. 5 is a diagram showing an operation when an external force is applied to the bending support according to an embodiment of the present disclosure.

Referring to (a) in FIG. 5, a free end of the curved part 122 having the curling shape of the bending support 120 may maintain a state that the free end does not contact the flat part 124. The curved part 122 may be formed such that the free end of the curling shape is spaced apart from the flat part 124 by a predetermined spacing to form a gap 610.

Referring to (b) of FIG. 5, when an external force of a certain pressure or higher than the certain pressure is applied in a direction of an arrow while the free end non-contacts the flat part 124, the free end of the curved part 122 of the curling shape is brought into contact with the flat part 124 under the external force.

When the external force of a certain pressure or higher than the certain pressure is applied while the free end non-contacts the flat part 124, the free end of the curved part 122 of the curling shape is brought into contact with the flat part 124 under the external force. Then, referring to (c) in FIG. 5, when the external force is removed, the free end may be removed from the flat part 124 and may be restored to its original state.

Referring to FIG. 6, a curved part 122' of a bending support 120' according to another embodiment of the present disclosure may have a curling shape whose an upper surface is bent in an arc shape from the bent area BA downwardly (in the Z direction).

In FIG. 4 to FIG. 6, a coating layer 126 may be formed on the outermost surface of the curved part 122 of the bending support 120 in the bent area BA. Therefore, when the curved part 122 of the bending support 120 contacts the display panel 100 of the bent area BA, contact frictional force may be reduced due to the coating layer 126. For example, the coating layer 126 may include a Teflon material.

In one example, referring to FIG. 7, the bending support 120 according to another embodiment of the present disclosure may include a first curling area CA1 (122a), a non-curling area NCA, and a second curling area CA2 (122b).

As shown in FIG. 7, the curved part 122 of the bending support 120 may have the first curved part 122a having a predetermined width and having a curling shape in one side in the width direction of the display panel 100 in the bent area BA.

Moreover, the curved part 122 of the bending support 120 may have the second curved part 122b having a predetermined width and having a curling shape in the other side in the width direction of the display panel 100 in the bent area BA.

The bending support 120 may have the non-curling area NCA having no curling shape and having a predetermined width in the width direction of the display panel 100 in the bent area BA, wherein the non-curling area NCA may be disposed between the first curved part 122a and the second curved part 122b.

A structure in which the curling areas and the non-curling areas may be alternately arranged with each other may be applied to the bending support 120. For example, the bending support may be divided into areas using a rigid material such as stainless (SUS) and may be subjected to the pressing process to improve the precision of bending and increase the precision of curling dimensions. Therefore, this may contribute to the minimization of the stress on the bent area of the panel based on the single-piece dimensional correction (and stabilization). For example, when multiple short aeras are formed in place of a single long area, the bending support may be managed at precise dimension.

The bending support 120 as shown in FIG. 3 to FIG. 7 may be made of a plastic material including at least one of polycarbonate (PC), polyimide (PI), polyethylene naphthalate (PEN), and polyethylene terephthalate (PET).

Moreover, the bending support 120 may include one material or a combination of at least two of stainless steel (SUS), glass, ceramic and metal.

In the bending support 120 shown in FIG. 3 to FIG. 7, the curved part 122 and the flat part 124 may include the same material.

In the bending support 120, the curved part 122 and the flat part 124 may be made of different materials.

In one example, in the display device 1, as described above, the first support plate BP1 may be disposed under the display panel 100 in the first area 1A, while the second support plate BP2 may be disposed on top of the display panel 100 in the second area 2A. The first support plate BP1 may be attached to a bottom face of the display panel 100 via the second adhesive layer AD2. The second support plate BP2 may be attached to a top face of the display panel 100 via the sixth adhesive layer AD6.

The first support plate BP1 may be disposed under the display panel 100 to supplement the rigidity of the display panel 100, while maintaining a portion constituting the front surface of the display panel 100 in a flat state.

Each of the first support plate BP1 and the second support plate BP2 may have a certain level or higher of strength and a predetermined value or larger of a thickness so as to supplement the rigidity of the display panel 100.

Since the first support plate BP1 is formed to have the certain strength and thickness to supplement the rigidity of the display panel 100, the first support plate BP1 may not be formed on the portion of the display panel 100 bent in the bent area BA.

In one example, the second support plate BP2 may be disposed in the second area 2A of the display panel 100.

The second support plate BP2 may be spaced apart from the first support plate BP1 by a predetermined spacing or larger and may be disposed on top of the display panel 100 in the second area 2A.

With reference to the shape of the display panel 100 before the display panel is bent, the second support plate BP2 may be disposed under the display panel 100 so as to be spaced apart from the first support plate BP1. The second support plate BP2 may be disposed under the display panel 100 to supplement the rigidity of the display panel 100 while maintaining the display panel 100 in a flat state. Since the second support plate BP2 is formed to have the certain strength and thickness to supplement the rigidity of the display panel 100, the second support plate BP2 may not be formed on a portion of the display panel 100 in the bent area BA. Embodiments of the present disclosure are not limited thereto.

After the display panel 100 is bent, the second support plate BP2 may be disposed on top of the display panel 100 in the bent area BA and the second area 2A.

The flat area of the bending support 120 including the flat shape may be disposed between the first support plate BP1 and the second support plate BP2.

The first support plate BP1 may be attached to the upper surface of the bending support 120 via the third adhesive layer AD3. The connection member or a bezel bending fixing tape 130 may be disposed under the bending support 120.

The connection member 130 fixing the display panel 100 in the bent state in the bent area BA in the bezel area BZA may be disposed in the second area 2 and may be disposed between the second support plate BP2 and the bending support 120. The connection member 130 may be bonded to the flat area of the bending support 120 via the fourth adhesive layer AD4, and may be adhered to the second support plate BP2 via the fifth adhesive layer AD5.

When bending the display panel 100 in the bent area BA so that the pad PAD of the display panel 100 is disposed on the rear surface of the portion of the display panel 100 in the second area 2A, the restoring force to allow the display panel to return to the state before the bending acts more strongly on the display panel 100.

When the restoring force acts strongly on the display panel 100, the pad PAD on the portion of the display panel 100 in the second area 2A in the bent state may not be fixed thereto and may lift off therefrom.

The connection member 130 may be disposed between the front surface of the display panel 100 and the pad PAD so as to serve to fix the bent display panel 100 to maintain its bent shape.

The connection member 130 may have formed to have a certain thickness, and may be embodied as a double-sided tape having strong adhesive strength capable of fixing the front surface of the display panel 100 and the pad PAD to each other.

The connection member 130 may be composed of at least one or more layers made of at least one material of an optical clear adhesive (OCA), an optical clear resin (OCR), or a pressure sensitive adhesive (PSA).

The connection member 130 may include a tape including a foam tape or a foam pad, and thus having a shock absorbing function or a double-sided tape having a conductive property. For example, the double-sided conductive tape may include an upper adhesive layer, a lower adhesive layer and a conductive layer between the upper adhesive layer and the lower adhesive layer, wherein each of the adhesive layers may also contain a conductive material.

The connection member 130 may be attached to the bending support 120 via the fourth adhesive layer AD4. In this regard, the bending support 120 may include an embossed layer in contact with the first support plate BP1; a cushion layer disposed under the embo layer and having a shock mitigation function; and a heat dissipation layer disposed under the cushion layer and having a heat dissipation function.

In one example, FIG. 3 and FIG. 6, the reinforcing member 110 reinforcing the bending of the display panel 100 may be disposed on an outer face of the display panel 100 in the bent area BA. In this regard, the reinforcing member 110 may include, for example, a micro coating layer. The micro coating layer (MCL) may be referred to as a micro cover layer (MCL).

The reinforcing member 110 may cover the portion of the display panel 100 of the bent area BA, may cover a portion of the display panel 100 of the first area 1A in contact with the bent area BA, and may cover the portion of the display panel 100 of the second area 2A. The reinforcing member 110 may include resin. An ultraviolet (UV) curable acryl resin may be used as the resin of the member 110. However, the present disclosure is not limited thereto.

Specifically, the reinforcing member 110 may be made of a cured product of a curable resin material that has been subjected to a curing process after coating the curable resin material. When the resin is used as an ultraviolet curable resin, the resin may be cured by ultraviolet rays.

The reinforcing member 110 may be disposed on an outer face of the display panel 100 so as to cover various signal lines between an encapsulation portion of the display panel 100 and the pad. Therefore, the reinforcing member 110 may prevent permeation into the signal line while protecting the signal line from external impact.

Moreover, the reinforcing member 110 may be disposed on the outer face of the display panel 100 in the bent area BA to supplement the rigidity of the display panel 100 in the bent area BA where the support plate is removed. The support plate may be attached to the bottom of the display panel 100 and then the display panel may be bent, and then the portion of the support plate in the bent area BA may be removed, such that the first support plate BP1 may remain under the display panel 100 in the first area 1A, while the second support plate BP2 may remain on top of the portion of the display panel 100 in the second area 2A. Therefore, the rigidity of the display panel 100 of the bent area BA in which the support plate has been removed may be weakened. However, the rigidity of the bent area BA may be supplemented by the reinforcing member 110 attached to the outer face of the display panel.

In the display device 1 as shown in FIG. 3 and FIG. 6, the components may be stacked in the vertical direction (Z direction) between the first area 1A and the second area 2A as follows.

For example, the reinforcing member 110 may be disposed on the back frame 30. The portion of the display panel 100 in the second area may be disposed on the reinforcing member 110. The sixth adhesive layer AD6 may be disposed on the portion of the display panel 100 in the second area.

Moreover, the second support plate BP2 may be disposed on the sixth adhesive layer AD6, and the fifth adhesive layer AD5 may be disposed on the second support plate BP2. The connection member 130 may be disposed on the fifth adhesive layer AD5.

Moreover, the fourth adhesive layer AD4 may be disposed on the connection member 130. The bending support 120 may be disposed on the fourth adhesive layer AD4. The third adhesive layer AD3 may be disposed on the bending support 120.

Moreover, the first support plate BP1 may be disposed on the third adhesive layer AD3. The second adhesive layer AD2 may be disposed on the first support plate BP1. The portion of the display panel 100 in the first area may be disposed on the second adhesive layer AD2.

Moreover, the first adhesive layer AD1 may be disposed on the portion f the display panel 100 in the first area. The polarization layer 140 may be disposed on the first adhesive layer AD1. The optical clear adhesive (OCA) 150 may be disposed on the polarization layer 150. The cover member 20 may be disposed on the optical adhesive layer 150.

The cover member 20 protects the display panel 100 from external impact and transmits light emitted from the display panel 100 therethrough so that an image displayed from the display panel 100 may be visible to the outside.

This cover member 20 may be made of one of polymethylmethacrylate (PMMA), polycarbonate (PC), cycloolefin polymer (COP), polyethylene terephthalate (PET), polyimide (PI), and polyaramid (PA) which have impact resistance and light transmission. Embodiments of the present disclosure are not limited thereto.

The optical adhesive layer 150 may have a thickness of, for example, 100 to 300 μm.

When the optical adhesive layer 150 has a thickness smaller than 100, the adhesive strength is weakened, making it difficult to modularize the cover member 20 and the support plates BP1 and BP2. When the optical adhesive layer 150 has a thickness larger than 300 µm, folding of the display device 1 may be difficult.

The polarization layer 140 prevents a decrease in the contrast ratio (CR) caused by external light. In the display device 1 according to the present disclosure, when the OLED panel is in a driving mode for rendering an image, the polarization layer 140 for blocking external light incident from the outside is disposed in a travel path of the light emitted from the display panel, thereby improving the contrast ratio.

When a portion of the bent area BA in a single support plate disposed across the first area 1A, the bent area BA, and the second area 2A is cut away, the first support plate BP1 may be disposed on the top of the flat part 124 of the bending support 120 and under the portion of the display panel 100 of the first area 1A, while the second support plate BP2 may be disposed under the flat area of the bending support 120 and above the portion of the display panel 100 in the second area 2A.

At this time, the portion of the support plate of the bent area BA may be cut away. Thus, the portion of the display panel 100 in the bent area BA may be exposed. Then, the reinforcing member 110 and the display panel 100 in the bent area BA may be bent so as to be attached to the connection member 130 via the second support plate BP2.

The reinforcing member 110 may suppress the deformation of the display panel 100 in the bent area BA and may allow the display panel 100 to be bent at a uniform curvature. The reinforcing member 110 may be composed of a resin layer to compensate for the weakening of rigidity caused by bending of the display panel 100 in the bent area BA. Moreover, the reinforcing member 110 may be made of a polymer such as polyimide (PI) or polyethylene terephthalate (PET). The reinforcing member 110 may have a modulus of about 1 to about 10 GPa when the reinforcing member is composed of a polymer film. Embodiments of the present disclosure are not limited thereto.

In FIG. 3 and FIG. 5, the back frame 30 may include a metal. Therefore, the back frame 30 made of a metal material may accommodate therein the components including the display panel 100 disposed on the rear surface of the cover member 20 and may protect the components.

In one example, when an external force of a certain pressure or a higher pressure is applied to the display device 1 or the back frame 30, the impact applied thereto may be alleviated by the bending support 120 in the bent area BA of the display device 1.

Therefore, cracks do not occur in the display panel 100 due to the shock absorbing action by the curved part 122 of the bending support 120, such that the display panel 100 may be protected.

Figure 8:
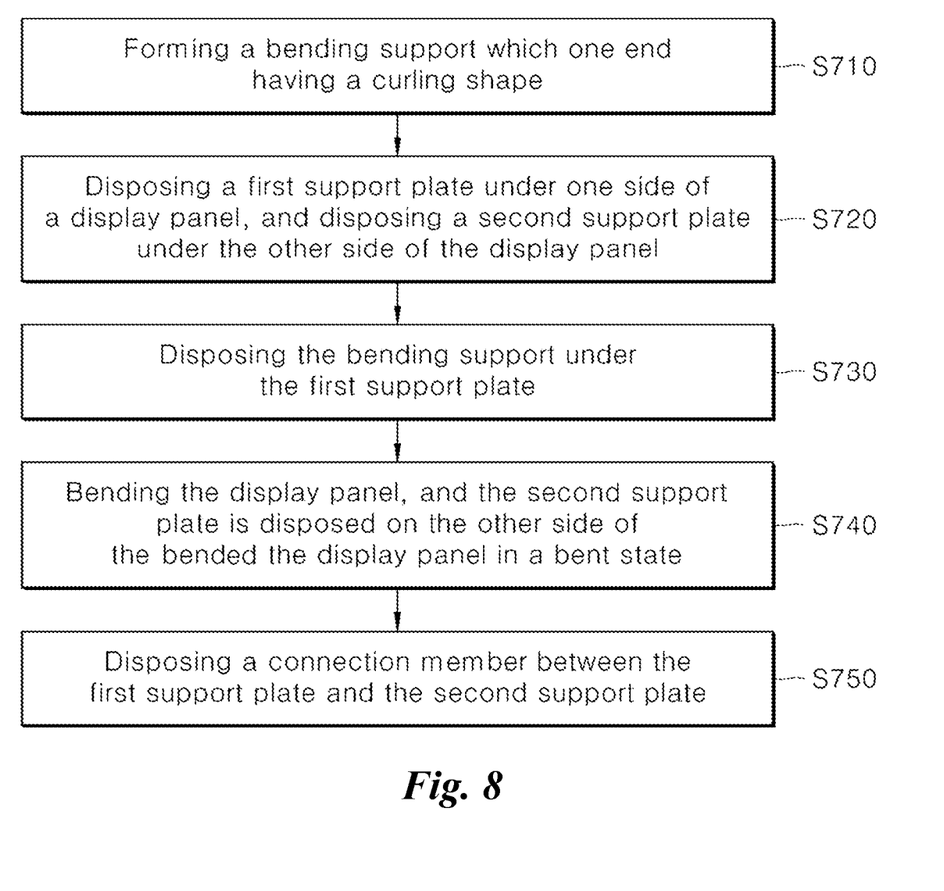
FIG. 8 is a diagram showing a manufacturing method of a display device according to an embodiment of the present disclosure.

FIG. 8 is a diagram showing a manufacturing method of a display device according to an embodiment of the present disclosure.

Referring to FIG. 8, in the manufacturing method of the display device 1 according to the embodiment of the present disclosure, first, the bending support 120 having the curling shape at one end thereof may be formed in S710.

The process of forming the bending support 120 may be performed in the same place along with a subsequent process, or may also be performed in a separate process in a separate place from the subsequent process.

In this regard, the bending support 120 may have the flat part 124 having a flat shape and the curved part 122 extending from the flat part 124 to the bent area BA and having the curling shape in the bent area BA of the display panel 100.

In this case, the curved part 122 may be formed such that the end of curved form of the curling shape is spaced apart from the flat part 124 by a predetermined spacing to form a stroke gap 610.

The stroke gap 610 means a separation space which may be generated or removed when the free end of the curling shape may contact the flat part 124 or may be removed therefrom (the stroke) depending on the presence or absence of the external force applied to the curved part 122.

Moreover, the bending support 120 may be formed by performing a press forming scheme of a metal made of stainless (SUS).

Moreover, the coating layer 126 may be formed on the outermost surface of the curling shape of the bending support 120 in contact with the display panel 100.

Then, the first support plate BP1 may be disposed on a bottom surface of one side of the display panel 100, while the second support plate BP2 may be disposed on a bottom surface of the other side of the display panel 100 in S720.

In this regard, a single support plate may be disposed on the bottom surface of the display panel 100. Then, the bent area BA of the single support plate may be cut away, such that the first support plate BP1 may be disposed under one side of the display panel 100, while the second support plate BP2 may be disposed under the other side of the display panel 100.

One side of the display panel 100 may have the flat shape in the display area AA, and may be adhered to the polarization layer 140 via the first adhesive layer AD1.

The polarization layer 140 may be adhered to the cover glass 20 via the optical adhesive layer OCA 150.

Subsequently, the bending support 120 may be disposed under the first support plate BP1 in S730.

The bending support 120 may be disposed under the first support plate BP1 so that the curved part 122 having a curling shape is disposed in the bent area BA. The bending support 120 may be bonded to the first support plate BP1 via the third adhesive layer AD3.

Then, the display panel 100 may be bent at the bent area BA, such that the second support plate BP2 may be positioned on the top surface of the other side of the bended the display panel 100 in the second area 2A in S740.

In this regard, the other side of the display panel 100 may be bonded to the second support plate BP2 via the sixth adhesive layer AD6.

Subsequently, the connection member 130 may be disposed between the first support plate BP1 and the second support plate BP2 in S750.

In this regard, the bending support 120 may be bonded to the connection member 130 via the fourth adhesive layer AD4. The connection member 130 may be adhered to the second support plate BP2 via the fifth adhesive layer AD5.

Accordingly, the second support plate BP2 may be adhered to the bending support 120 by the connection member 130 for fixing the display panel 100 in the bent state.

In this regard, the connection member 130 may be composed of at least one or more layers made of at least one material of an optical clear adhesive (OCA), an optical clear resin (OCR), or a pressure sensitive adhesive (PSA).

One end of the bending support has the curling shape, and the outermost surface of the curling shape may be curved and may be in contact with an inner curved surface of the bent portion of the display panel 100 as shown in FIG. 3.

In this regard, the second support plate BP2 may be adhered to the bent portion of the display panel 100 via the sixth adhesive layer AD6.

In one example, a driver integrated circuit may be disposed on the other surface of the pad PAD of the display panel 100 opposite to one surface thereof on which the second support plate BP2 is disposed.

The driver integrated circuit may be mounted on the display panel 100 via a chip bonding process or a surface mounting process. In the bent state, the driver integrated circuit may be disposed under the display panel 100. For example, the driver integrated circuit may be disposed under the pad PAD.

In this case, a flexible printed circuit board (FPCB) (not shown) may be disposed between the pad PAD and the driver integrated circuit, such that the driver integrated circuit may be disposed on a rear surface of the flexible printed circuit board (FPCB).

The driver integrated circuit generates data signals and gate control signals based on video data and timing synchronization signals supplied from an external host driver system. Then, the driver integrated circuit may supply the data signal to the data line of each pixel through the pad PAD, and may supply the gate control signal to a gate driver circuit (not shown) through the pad PAD.

The driver integrated circuit may be mounted on a chip mounting area defined in the display panel 100 and may be electrically connected to the pad PAD, and may be connected to each of the gate driver circuit disposed on the display panel 100 and a signal line of a pixel array.

Since the driver integrated circuit (IC) generates considerable heat, it is necessary to effectively dissipate the heat from the driver integrated circuit. The heat from the driver integrated circuit may be first dissipated through the support plate.

The pad PAD may be disposed on one side of the display panel 100 such that the driver integrated circuit may be mounted on the pad.

The pad PAD on the rear surface of the display panel 100 may be electrically connected to the flexible printed circuit board on which the driver IC is mounted.

One side of the flexible printed circuit board may be electrically connected to the pad PAD provided on one side of the display panel 100 in a film attachment process using a conductive adhesive layer as a medium. Thus, the flexible printed circuit board may be disposed on the rear surface of the display panel 100.

In this case, the conductive adhesive layer may be embodied as an anisotropic conductive film (ACF) by way of example.

The flexible printed circuit board (FPCB) may provide the image data and the timing synchronization signals supplied from the host driver system to the driver integrated circuit, and may provide each of voltages necessary for driving each of the pixel array, the gate driver circuit, and the driver integrated circuit.

The flexible printed circuit board having one side connected to the display panel 100 may be bent along with the display panel 10 toward the rear surface facing the front surface of the display panel 100.

The flexible printed circuit board having one side connected to the display panel 100 may be bent so as to be disposed on a portion of the rear surface of the display panel 100 not covered with the pad PAD of the display panel 100.

Accordingly, at least a portion of the flexible printed circuit board may contact the rear surface of the display panel 100.

The display device 1 according to an embodiment of the present disclosure refers to a display device having flexibility, and may include a bendable display device, a rollable display device that can be rolled, an unbreakable display device that does not break, and a foldable display device that can be folded.

The driver integrated circuit may be implemented as a TFT (thin film transistor) in the non-display area NA. This driver integrated circuit may be referred to as a GIP (gate-in-panel) circuit. The GIP circuit includes a gate driver of a GIP structure, wherein the gate driver is embodied as a bottom gate type thin-film transistor (BG-T), and a source and drain metal film of a bridge line extends so as to connected to a drain electrode of the BG thin-film transistor.

Moreover, some components, such as the data driver IC may be mounted on a separate printed circuit board, or may be coupled to a connection interface (pads/bumps, pins, etc.) disposed in the non-display area NA using a circuit film such as FPCB (flexible printed circuit board), COF (chip-on-film), or TCP (tape-carrier-package). The non-display area NA may be bent along with the connection interface, so that the printed circuit (COF, PCB, etc.) may be disposed on the rear surface (or the back surface) of the display device 1.

The display device 1 according to the present disclosure may include various additional components for generating various signals or driving the pixel PX in the display area. The additional components to drive the pixel may include an inverter circuit, a multiplexer, an electrostatic discharge circuit. The display device 1 according to the present disclosure may include additional components related to functions other than the function of driving the pixel. For example, the display device 1 according to the present disclosure may include additional components that provide a touch sensing function, a user authentication function such as fingerprint recognition, a multi-level pressure sensing function, and a tactile feedback function. The above-mentioned additional components may be disposed in an external circuit connected to the non-display area NA and/or the connection interface.

According to the present disclosure, several portions of the display device 1 may be bent along a bending line. The bending line may extend transversely, longitudinally, or diagonally. Accordingly, the display device 1 according to an embodiment of the present disclosure may be bent in a combination of the transverse, longitudinal and diagonal directions based on a required design.

According to the present disclosure, one or more corner edges of the display device 1 may be bent along the bending line so as to be away from a central portion. The bending line may be disposed closer to the edge of the display device 1, but may extend across the central portion, or may extend diagonally from one or more corners of the display device 1. This structure may enable the display device 1 to be embodied as a foldable display device or a display device in which an image is displayed from each of both folded surfaces facing each other.

Since one or more portions of the display device 1 may be bent, the display device 1 according to the present disclosure may be divided into a substantially flat area and a curved area. One portion of the display device 1 may be referred to as a substantially flat area. One portion of the display device 1 may be bent at a predetermined angle, and this portion may be referred to as a bent area or a curvature area. The curvature area includes a bent section that is actually bent at a predetermined curvature radius.

The term "substantially flat" means that the substantially flat area includes a portion which is not perfectly flat. For example, a concave central portion and a convex central portion may belong to the substantially flat area in some embodiments. One or more bent sections may be present next to the concave central portion or the convex central portion, and are bent inwardly or outwardly at an angle relative to a bending axis along the bending line. The curvature radius of the curvature area is smaller than that of the flat area. In other words, the term "substantially flat area" means a portion with a smaller curvature than that of a portion adjacent thereto.

Depending on a position of the bending line, a portion on one side of the bending line is positioned toward the center of the display device 1, while a portion on the other side of the bending line is positioned toward the edge of the display device 1. A portion positioned toward the center of the display device 1 may be referred to as a central portion, and a portion positioned toward the edge of the display device 1 may be referred to as an edge portion. The central portion of the display device 1 may be substantially flat, and the edge portion may be a bent section. However, this is not always true. The substantially flat area may also be disposed in the edge portion. Further, in some shapes of the display device 1, the bent section may be disposed between two substantially flat areas.

When the non-display area NA is bent, the non-display area NA may be invisible or minimally visible to a viewer in front of the display device 1. A portion of the non-display area NA visible to the view in front of the display device 1 may be screened with a bezel. The bezel may be formed as a stand-alone structure, or as a housing or another suitable element. A portion of the non-display area NA visible to the view in front of the display device 1 may be hidden under an opaque mask layer such as a black ink layer made of black ink (e.g., a polymer filled with carbon black). Such an opaque mask layer may be disposed on various layers (e.g., a touch sensor layer, a polarization layer, a cover layer, and the like) included in the display device 1.

In some embodiments, the bent section of the display device 1 may include a display area capable of displaying an image. That is, the bending line may be disposed in the display area so that at least some of pixels of the display area are included in the bent section.

As described above, according to the embodiment of the present disclosure, the display device may be realized in which when stress due to external force occurs in the bent area of the panel of the display device, deformation and screen defects may be minimized using the inner structure.

Moreover, according to the embodiment of the present disclosure, the display device may be realized in which reinforcing the rigidity of the panel bent area using the structure of the bending support without adding a separate part thereto may achieve process simplification, the reduced manufacturing cost and the improved product quality.

Further, according to the embodiment of the present disclosure, the display device manufacturing method may be realized in which the bending support has the curling shape and the outermost surface of the curling shape is curved and is in contact with a curved inner surface of the bent portion of the bent area of the display panel, thereby minimizing deformation of the bent area due to external force and thus preventing the panel cracks.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a display panel including a first area, a second area, and a bent area;
   a first support plate disposed under the display panel, the first support plate supporting the first area and the bent area of the display panel;
   a second support plate disposed on the display panel, the second support plate supporting the second area of the display panel; and
   a bending support disposed under the first support plate and between the first support plate and the second support plate, the bending support providing support for a bent portion of the bent area of the display panel,
   wherein the bending support has a curling shape in the bent area,
   wherein an outermost surface of a curved form of the curling shape of the bending support is in contact with a curved inner surface of the bent portion of the bent area of the display panel;
   wherein in the bent area, an end of the curved form of the curling shape of the bending support is spaced from a flat area of the bending support.

2. The display device of claim 1, wherein the bending support includes:
   a flat part having a flat shape corresponding to the second area of the display panel; and
   a curved part extending from the flat part toward the bent area of the display panel,
   wherein the curved part is curved in the bent area so as to have the curling shape.

3. The display device of claim 2, wherein the curved part integrally extends from one side to an opposite side by a width of the display panel along a width direction of the display panel in the bent area.

4. The display device of claim 2, wherein an end of the curved part of the curling shape of the bending support is spaced from the flat part of the bending support.

5. The display device of claim 4, wherein the end of the curved part of the curling shape is brought into contact with the flat part in response to an external force being applied to the curved part of the curling shape while the end of the curved part is spaced from the flat part.

6. The display device of claim 5, wherein the end of the curved part of the curling shape is brought into contact with the flat part in response to the external force being applied to the curved part of the curling shape,
wherein in response to removal of the external force applied to the curved part of the curling shape, the end of the curved part of the curling shape is restored to an original state so as to be spaced from the flat part.

7. The display device of claim 2, wherein the outermost surface of the curved part of the curling shape includes a coating layer.

8. The display device of claim 7, wherein the coating layer includes a Teflon material.

9. The display device of claim 1, wherein the bending support includes:
a first curved part having a first curling shape and constituting a first side of the bending support, wherein the first curved part extends in a width direction of the display panel in the bent area;
a second curved part having a curling shape and constituting a second side opposite to the first side of the bending support, wherein the second curved part extends in the width direction of the display panel and in the bent area; and
a non-curling part disposed between the first curved part and the second curved part.

10. The display device of claim 1, wherein the bending support is a plastic material including at least one of polycarbonate, polyimide, polyethylene naphthalate, or polyethylene terephthalate.

11. The display device of claim 1, wherein the bending support is glass, ceramic, or metal, or a combination of at least two thereof.

12. The display device of claim 1, wherein the bending support is stainless steel.

13. The display device of claim 1, wherein the bending support includes a metal.

14. The display device of claim 1, wherein the first area is a display area of the display panel,
wherein the second area includes a pad of the display panel,
wherein the first area and the second area face each other in a vertical direction.

15. The display device of claim 14, wherein the display panel has a flat shape in the first area, has a downwardly bent shape in the bent area, and has a flat shape in the second area.

16. The display device of claim 1, further comprising:
a connection member disposed between the second support plate and the bending support,
wherein the connection member fixes the display panel in the second area.

17. The display device of claim 16, wherein the connection member includes at least one layer, the at least one layer including at least one of optical clear adhesive OCA, optical clear resin OCR, and pressure-sensitive adhesive PSA.

18. The display device of claim 16, wherein the connection member includes a tape including a foam tape or a foam pad, or a double-sided tape having a conductive ability.

19. The display device of claim 1, wherein the bending support includes:
an embossed layer in contact with the first support plate;
a cushion layer disposed under the embossed layer; and
a heat dissipation layer disposed under the cushion layer.

20. The display device of claim 1, further comprising:
a reinforcing member disposed on an outer surface of the display panel in the bent area.

21. The display device of claim 20, wherein the reinforcing member includes a micro-coating layer.

22. The display device of claim 20, wherein the reinforcing member covers the display panel in the bent area, the reinforcing member extending to cover a portion of the display panel in the first area that is in contact with the bent area, and to cover the display panel in the second area.

* * * * *